(12) United States Patent
Jeung et al.

(10) Patent No.: US 6,841,418 B2
(45) Date of Patent: Jan. 11, 2005

(54) MULTI-SUBSTRATE MICROELECTRONIC PACKAGES AND METHODS FOR MANUFACTURE

(75) Inventors: Boon Suan Jeung, Singapore (SG); Chia Yong Poo, Singapore (SG); Low Siu Waf, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/767,290

(22) Filed: Jan. 28, 2004

(65) Prior Publication Data

US 2004/0183207 A1 Sep. 23, 2004

Related U.S. Application Data

(62) Division of application No. 10/033,340, filed on Dec. 26, 2001, now Pat. No. 6,750,547.

(51) Int. Cl.[7] .............................................. H01L 21/44
(52) U.S. Cl. ..................... 438/108; 257/701; 257/713; 257/778; 257/783; 257/787; 310/307
(58) Field of Search .......................... 310/307; 257/701, 257/713, 778, 783, 787

(56) References Cited

U.S. PATENT DOCUMENTS

| 4,794,092 A | 12/1988 | Solomon |
| 5,128,831 A | 7/1992 | Fox, III et al. |
| 5,252,857 A | 10/1993 | Kane et al. |
| 5,518,957 A | 5/1996 | Kim |
| 5,714,800 A | 2/1998 | Thompson |
| 5,808,872 A | 9/1998 | Ozawa |
| 5,841,193 A | 11/1998 | Eichelberger |
| 5,851,845 A | 12/1998 | Wood et al. |
| 5,883,426 A | 3/1999 | Tokuno et al. |
| 5,891,797 A | 4/1999 | Farrar |

(List continued on next page.)

OTHER PUBLICATIONS

Zwenger, Curtis and Ted Tessier, "Technologies and Trends in Wafer Level Packaging," Enabling a Microelectronic World, Amkor Technology, Inc., 29 pages, 2001.
EPIC CSP™ Chip Scale Package Technology, "Low Cost Area Array Package Fully Integrates Printed Circuit, Chip Interconnect and Assembly," EPIC Technologies, Inc., 30 pages.
Lau, John H. and Shi–Wei Ricky Lee, *Chip Scale Package(CSP). Design, Materials, Processes, Reliability, and Applications*, pp. 355, 487–488, ISBN 0–07–038304–9, Feb. 1999, McGraw–Hill, New York.

*Primary Examiner*—David Nelms
*Assistant Examiner*—Mai-Huong Tran
(74) *Attorney, Agent, or Firm*—Perkins Coie LLP

(57) ABSTRACT

A microelectronic package and method for manufacture. The package can include first and second microelectronic substrates, each having a first surface with a connection site, and a second surface facing opposite the first surface. The second microelectronic substrate can be coupled to the first microelectronic substrate with the second surface of the second microelectronic substrate facing towards the first surface of the first microelectronic substrate. A conformal conductive link formed, for example, from sequentially deposited portions of conductive material, can be coupled between the first and second connection sites to provide for electrical communication between the substrates. Accordingly, the substrates can be stacked and electrically connected to reduce the footprint occupied by the substrates.

49 Claims, 6 Drawing Sheets

U.S. PATENT DOCUMENTS

| | | | |
|---|---|---|---|
| 5,892,287 A | 4/1999 | Hoffman et al. |
| 5,933,713 A | 8/1999 | Farnworth |
| 5,946,553 A | 8/1999 | Wood et al. |
| 5,986,209 A | 11/1999 | Tandy |
| 5,990,566 A | 11/1999 | Farnworth et al. |
| 6,004,867 A | 12/1999 | Kim et al. |
| 6,008,070 A | 12/1999 | Farnworth |
| 6,020,624 A | 2/2000 | Wood et al. |
| 6,020,629 A | 2/2000 | Farnworth et al. |
| 6,025,640 A | 2/2000 | Yagi et al. |
| 6,028,365 A | 2/2000 | Akram et al. |
| 6,051,878 A | 4/2000 | Akram et al. |
| 6,072,233 A | 6/2000 | Corisis et al. |
| 6,072,236 A | 6/2000 | Akram et al. |
| 6,124,634 A | 9/2000 | Akram et al. |
| 6,153,924 A | 11/2000 | Kinsman |
| 6,175,149 B1 | 1/2001 | Akram |
| 6,184,465 B1 | 2/2001 | Corisis |
| 6,187,615 B1 | 2/2001 | Kim et al. |
| 6,211,598 B1 * | 4/2001 | Dhuler et al. ............... 310/307 |
| 6,212,767 B1 | 4/2001 | Tandy |
| 6,225,689 B1 | 5/2001 | Moden et al. |
| 6,228,548 B1 | 5/2001 | King et al. |
| 6,228,687 B1 | 5/2001 | Akram et al. |
| 6,232,655 B1 | 5/2001 | Sugimura |
| 6,235,552 B1 | 5/2001 | Kwon et al. |
| 6,235,554 B1 | 5/2001 | Akram et al. |
| 6,258,623 B1 | 7/2001 | Moden et al. |
| 6,261,865 B1 | 7/2001 | Akram |
| 6,281,577 B1 | 8/2001 | Oppermann et al. |
| 6,294,839 B1 | 9/2001 | Mess et al. |
| 6,297,547 B1 | 10/2001 | Akram |
| 6,303,981 B1 | 10/2001 | Moden |
| 6,320,250 B1 | 11/2001 | Takahashi |
| 6,326,697 B1 | 12/2001 | Farnworth |
| 6,326,698 B1 | 12/2001 | Akram |
| 6,344,234 B1 | 2/2002 | Dalal et al. |
| 6,380,629 B1 | 4/2002 | Kim |
| 6,396,975 B1 | 5/2002 | Wood et al. |
| 6,407,381 B1 | 6/2002 | Glenn et al. |
| 6,503,780 B1 | 1/2003 | Glenn et al. |
| 2001/0009300 A1 | 7/2001 | Sugimura |
| 2002/0153615 A1 | 10/2002 | Komiyama et al. |
| 2003/0071335 A1 | 4/2003 | Jeung et al. |
| 2003/0071338 A1 | 4/2003 | Jeung et al. |
| 2003/0071341 A1 | 4/2003 | Jeung et al. |
| 2003/0080403 A1 | 5/2003 | Jeung et al. |

* cited by examiner

MULTI-SUBSTRATE MICROELECTRONIC PACKAGES AND METHODS FOR MANUFACTURE

CROSS-REFERENCE TO RELATED APPLICATION

This application is a divisional application of U.S. patent application Ser. No. 10/033,340, entitled "MULTI-SUBSTRATE MICROELECTRONIC PACKAGES AND METHODS FOR MANUFACTURE," filed on Dec. 26, 2001, now U.S. Pat. No. 6,750,547, issued Jun. 15, 2004, which is incorporated herein by reference in its entirety.

BACKGROUND

The present invention relates generally to multi-substrate microelectronic packages, such as stacked microelectronic substrate packages, and methods for manufacturing such packages. Conventional packaged semiconductor products typically include a microelectronic die at least partially surrounded by a protective encapsulant. The die within the encapsulant is electrically connected to external terminals accessible from outside the encapsulant for coupling the die to other microelectronic components. The coupled microelectronic components can be housed in a computer, telecommunication device, or other consumer or industrial electronic product.

As the size of the electronic products into which the microelectronic packages are incorporated has decreased, it has become necessary to decrease the size of the packages. One approach to reducing the size of the microelectronic packages is to stack one die on top of another within the package, which reduces the total planform area or footprint occupied by the two dies. The stacked dies within the package are then electrically connected to each other with wire bonds. One drawback with this approach is that wire-bonding the dies can place stresses on the dies that can ultimately cause the dies to fail. Another drawback is that the wire bonds can break loose from the dies. Still another drawback is that signals may travel too slowly between the dies, due to the length of the wire bonds. Yet another drawback is that the individual dies can be difficult to handle during the stacking and bonding operation, due to the relatively small size of the dies.

SUMMARY

The present invention is directed toward multi-substrate microelectronic packages and methods for forming such packages. A method in accordance with one aspect of the invention includes positioning a first microelectronic substrate proximate to a second microelectronic substrate and coupling the microelectronic substrates to form a substrate assembly. Each microelectronic substrate has a first surface with a connection site, and a second surface facing opposite the first surface. The microelectronic substrates are coupled such that the first surface of the first microelectronic substrate faces toward the second surface of the second microelectronic substrate. The method can further include sequentially disposing at least first and second portions of a conductive material on the substrate assembly to build up a conductive structure connected between the connection sites of the microelectronic substrates.

In a further aspect of the invention, a plurality of second microelectronic substrates can be attached to a corresponding plurality of first microelectronic substrates while the first microelectronic substrates are attached to each other to define at least a portion of a microelectronic wafer. Conductive material can then be sequentially disposed to connect connection sites of the first microelectronic substrates with connection sites of the second microelectronic substrates. The resulting substrate assemblies are then separated from each other.

The invention is also directed toward a microelectronic device package. In one aspect of the invention, the device package can include a first microelectronic substrate having a first surface with a first connection site, and a second surface facing opposite the first surface. The package can further include a second microelectronic substrate having a first surface with a second connection site and a second surface facing opposite the first surface. The second microelectronic substrate can be coupled to the first microelectronic substrate with the second surface of the second microelectronic substrate facing toward the first surface of the first microelectronic substrate. A conformal conductive link can be coupled between the first and second connection sites, and can conform at least generally to a contour of the substrate assembly immediately adjacent to the conformal conductive link. In a further aspect of the invention, an adhesive film can be disposed between the first and second microelectronic substrates. In still a further aspect of the invention, the first microelectronic substrate can have an exposed edge between the first and second surfaces. In yet a further aspect of the invention, the microelectronic device package can be positioned in the housing of an electronic device.

DETAILED DESCRIPTION

Figure 1A:
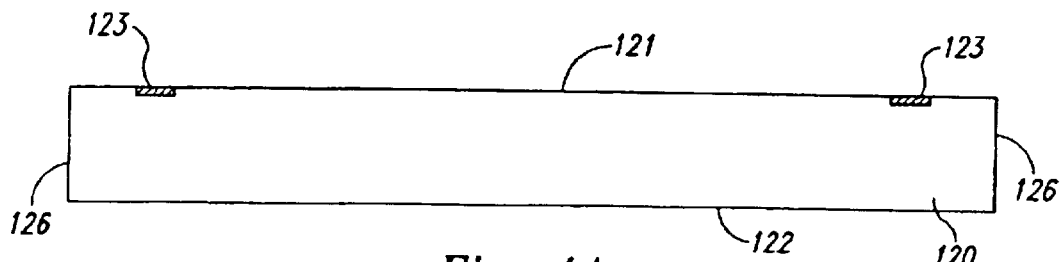
FIGS. 1A-G illustrate process steps for disposing a connection structure between two stacked microelectronic substrates in accordance with an embodiment of the invention.

The present disclosure describes methods and apparatuses for stacking microelectronic substrates. The term "microelectronic substrate" is used throughout to include substrates upon which and/or in which microelectronic circuits or components, data storage elements or layers, and/or vias or conductive lines are or can be fabricated. Many specific details of certain embodiments of the invention are set forth in the following description and in FIGS. 1A-6 to provide a through understanding of these embodiments. One skilled in the art, however, will understand that the present invention may have additional embodiments, and that the invention may be practiced without several of the details described below.

FIGS. 1A-G schematically illustrate a process for electrically connecting two stacked microelectronic substrates in accordance with an embodiment of the invention. Beginning with FIG. 1A, a first microelectronic substrate 120 can include a first surface 121, a second surface 122 facing opposite from the first surface 121, and edges 126 positioned between the first surface 121 and the second surface 122. The first surface 121 can include first connection sites 123, such as bond pads, which are exposed at the first surface 121 and which are connected to microelectronic structures within the first microelectronic substrate 120.

Figure 1B:
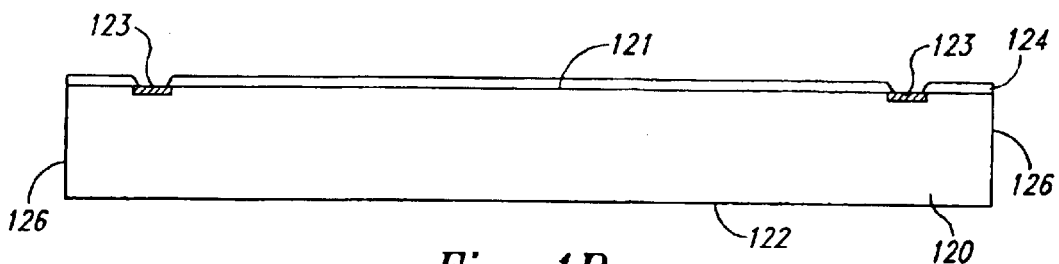
Figure 1C:
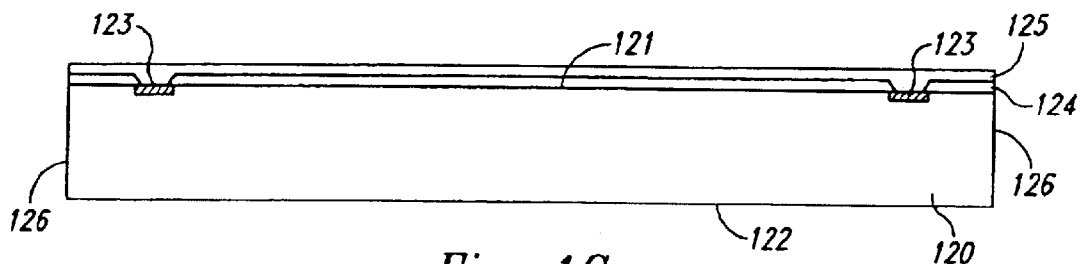

In FIG. 1B, a passivation layer 124, such as a polymer, nitride and/or oxide layer, is disposed on the first surface 121 of the first microelectronic substrate 120. The passivation layer 124 can protect the first surface 121 during subsequent operations. The passivation layer 124 includes openings aligned with the first connection sites 123. In FIG. 1C, a first dielectric material 125, such as a dielectric layer, can be disposed on the passivation layer 124. The first dielectric material 125 can electrically isolate features of the first microelectronic substrate 120 from structures disposed on the first microelectronic substrate 120 in subsequent steps, as described below. The first dielectric material 125 can also provide an adhesive connection between the first microelectronic substrate 120 and a second microelectronic substrate.

In one embodiment, the first dielectric material 125 can include an SU-8 resist material available from IBM of New York, N.Y., a BCB dielectric material available from Dow Chemical Co. of Midland, Mich., and/or a PIX polyimide available from Hitachi Chemical of Tokyo, Japan. In other embodiments, the first dielectric material can include other compositions. In any of these embodiments, the first dielectric material 125 can be applied in a printing encapsulation form, for example, according to a stencil-like process available from Sanyo Rec Co., Ltd. of Osaka, Japan. Optionally, the first dielectric material 125 can also be spin-coated onto the first microelectronic substrate 120. In any of these embodiments, the first dielectric material 125 can be a polymeric, thermoset material. While the first dielectric material 125 is still tacky, it can receive and attach to a second microelectronic substrate, as described below.

Figure 1D:
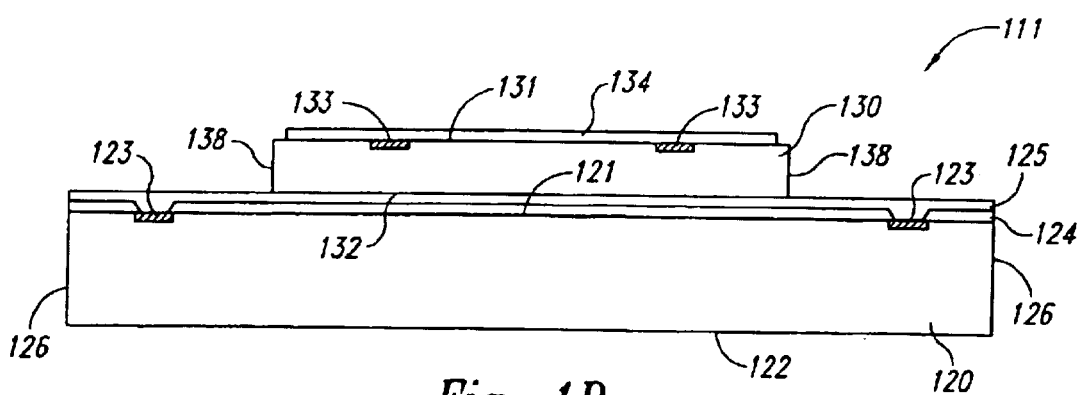

As shown in FIG. 1D, a second microelectronic substrate 130 can be disposed on and attached to the first microelectronic substrate 120 to form an assembly 111. The second microelectronic substrate 130 can have a first surface 131, a second surface 132 facing opposite from the first surface 131, and edges 138 between the first surface 131 and the second surface 132. The first surface 131 can include second connection sites 133, such as bond pads. In one aspect of this embodiment, the planform area of the second microelectronic substrate 130 can be smaller than that of the first microelectronic substrate 120 so that the second microelectronic substrate 130 does not cover the first connection sites 123. In other embodiments, the second microelectronic substrate 130 can have other shapes that allow electrical connections to be made to the first connection sites 123. In any of these embodiments, the first dielectric material 125 can be fully cured after the second microelectronic substrate 130 is attached and bond pad via holes in the first dielectric material 125 are exposed or opened, as described below with reference to FIG. 1F. Then, a passivation layer 134 can be disposed on the first surface 131 of the second microelectronic substrate 130 to protect the second microelectronic substrate 130 during subsequent processing steps.

In one aspect of this embodiment, the first dielectric material 125 can provide for electrical isolation between the first microelectronic substrate 120 and the second microelectronic substrate 130, and can also provide for adhesion between the two microelectronic substrates. Accordingly, the first dielectric material 125 can form an adhesive bond between the passivation layer 124 disposed on the first microelectronic substrate 120, and the second surface 132 of the second microelectronic substrate 130. In other embodiments, the second microelectronic substrate 130 can be attached or otherwise coupled to the first microelectronic substrate 120 with other structures, such as adhesive films, as described below with reference to FIG. 3.

In one embodiment, the first microelectronic substrate 120 can include an SRAM memory chip and the second microelectronic substrate 130 can include a flash memory chip. In other embodiments, the first and second microelectronic substrates 120, 130 can include other devices, such as processor devices. In any of these embodiments, the first and second microelectronic substrates 120, 130 can include devices that are advantageously packaged in close proximity to each other for, inter alia, ease of handling and/or reducing signal transmission times between the devices.

Figure 1E:
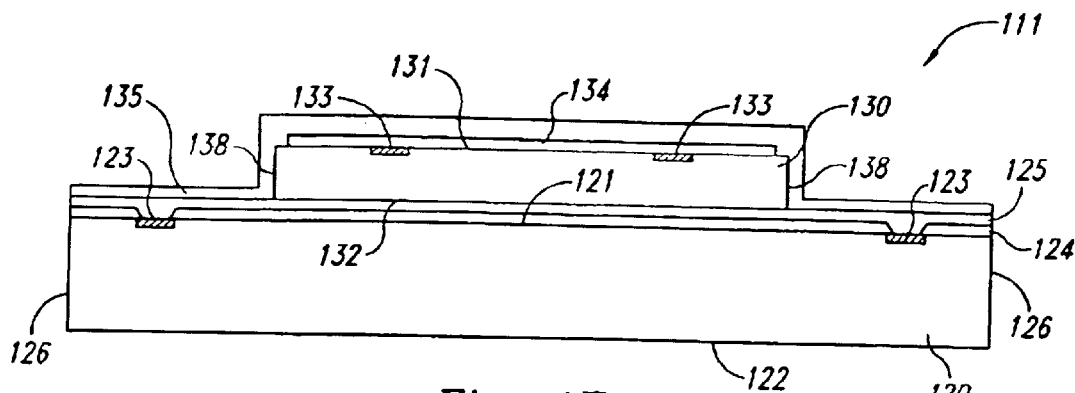

As shown in FIG. 1E, a second dielectric material 135 (such as silicon dioxide or silicon nitride) can be disposed on the assembly 111 to extend over the first dielectric material 125 on the first microelectronic substrate 120, and over the passivation layer 134 on the second microelectronic substrate 130. In one embodiment, two or more process steps may be combined to dispose the second dielectric material 135 (and also the first dielectric material 125). For example, dielectric material having a first viscosity can be disposed with a liquid encapsulation dispensing machine (i.e., dispensed through needles) to fill underlying gaps, such as gaps between neighboring first microelectronic substrates on a wafer. Then additional dielectric material having a different viscosity can be dispensed in a spin-coating or spray coating process. In any of the foregoing embodiments, the materials and/or process steps can be selected and/or modified as desired in a manner known to those of ordinary skill in the relevant art. For example, the dielectric materials and process steps can be selected to produce a selected rate and amount of shrinkage upon curing, and/or fillers can be added to modify the coefficient of expansion of the dielectric material.

Figure 1F:
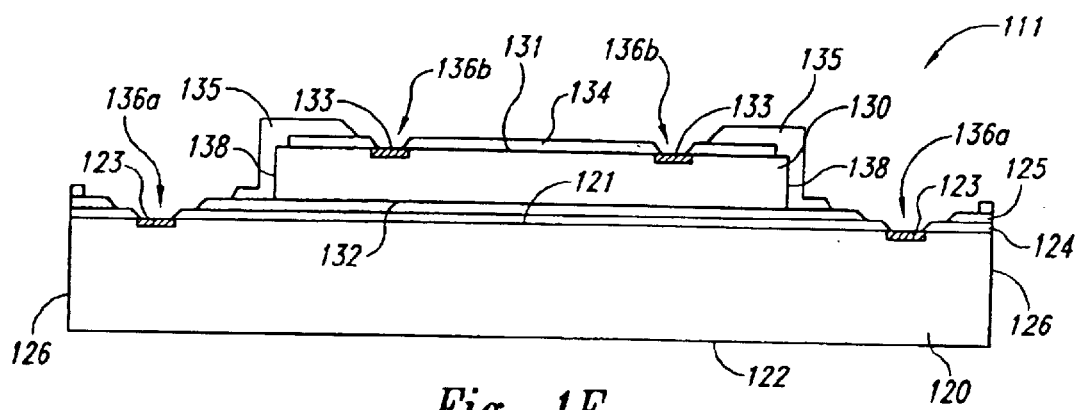

As shown in FIG. 1F, apertures 136 (shown as first apertures 136a and second apertures 136b) can be formed in the assembly 111. For example, the first apertures 136a can extend through the second dielectric material 135 and the first dielectric material 125 provide access to the first connection sites 123 of the first microelectronic substrate 120. The second apertures 136b can extend through the second dielectric material 135 and the passivation layer 134 to the second connection sites 133 of the second microelectronic substrate 130. In one aspect of this embodiment, the apertures 136 can be formed with conventional single or dual damascene photolithographic processes. Alternatively, other techniques can be used to form the apertures 136.

Figure 1G:
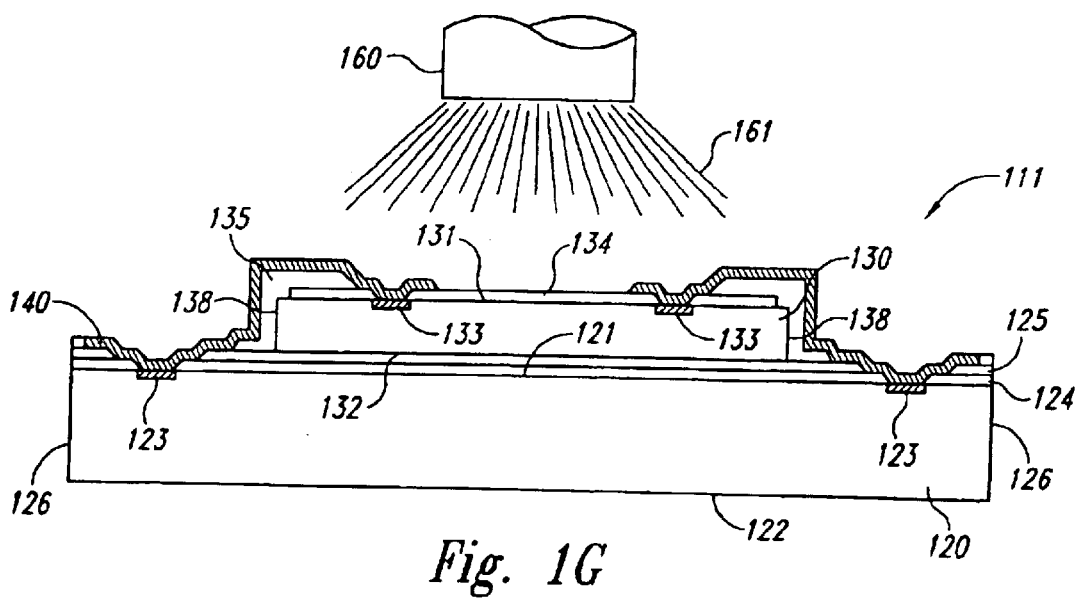

As shown schematically in FIG. 1G, the assembly 111 can be aligned with a disposing apparatus 160 that disposes a conductive material 161 onto the assembly 111. The conductive material 161 can include aluminum, copper titanium, tungsten, tungsten-nickel, gold and/or other conductive elements and/or alloys and/or combinations thereof. In one embodiment, the conductive material 161 can be disposed using a physical vapor deposition process. Alternatively, the disposing apparatus 160 can employ a chemical vapor deposition process, a sputtering process, or another type of deposition process. In any of these foregoing embodiments, the conductive material 161 can be sequentially disposed on the assembly 111 to build up a connection structure 140. For example, the conductive material 161 can be disposed in a continuous process with a first portion of the conductive material 161 disposed on the exposed surface of the assembly 111, a second portion disposed on the first portion, a third portion disposed on the second portion and so on until the connection structure 140 attains an appropriate thickness. Accordingly, the resulting connection structure can include a series of elongated conductive links that conform to the surface on which the conductive material 161 is disposed, and extend in up to three orthogonal directions to connect the first connection sites 123 located in one plane with the second connection sites 133 located in another plane. In a further aspect of this embodiment, the connection structure 140 can be self supporting. Alternatively, the connection structure 140 can be non-self-supporting, and can be supported by the structure on which it is disposed.

Figure 2A:
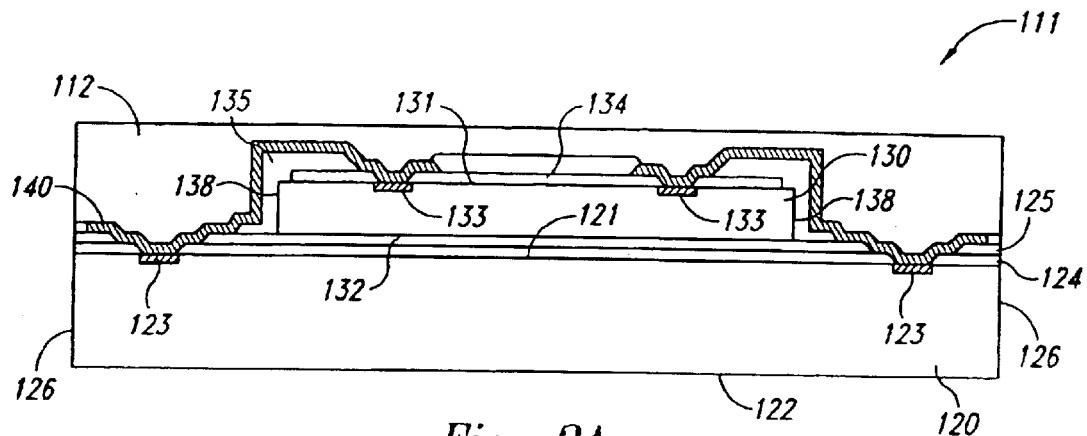
FIGS. 2A-E illustrate process steps for coupling the connection structure to externally accessible terminals in accordance with an embodiment of the invention.
Figure 2B:
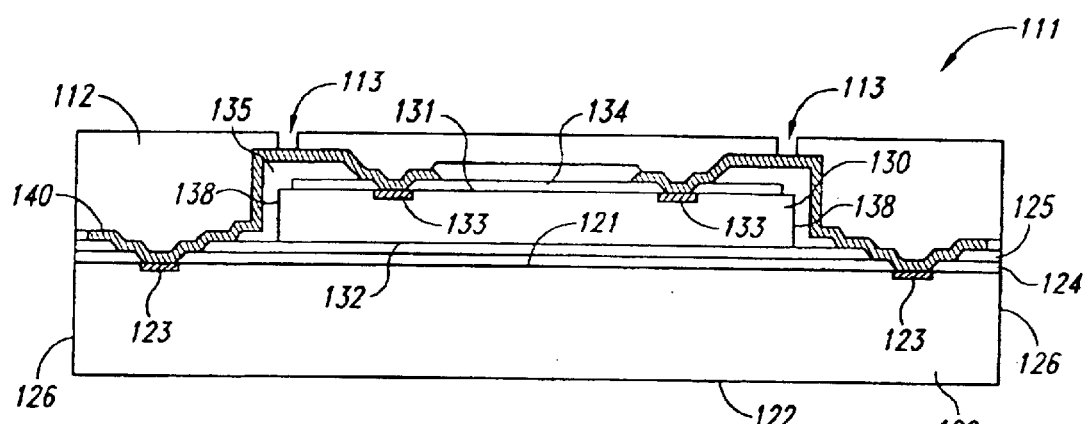
Figure 2C:
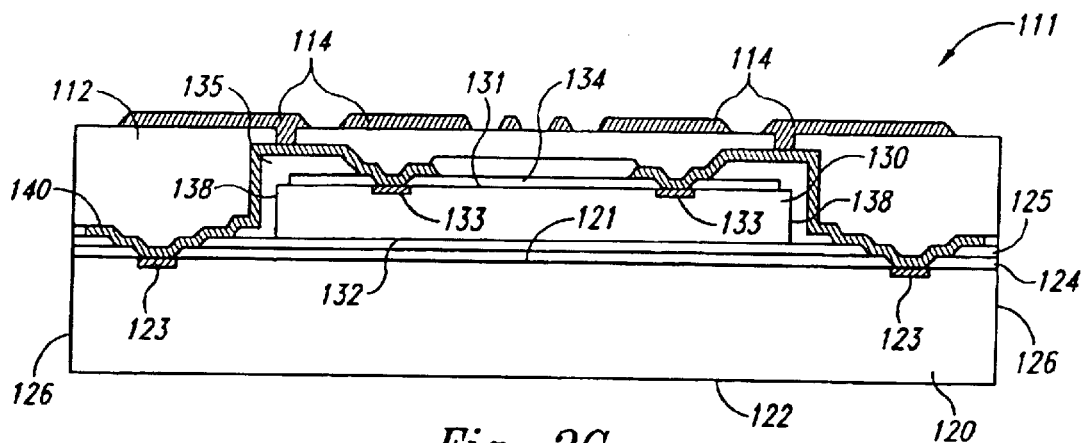

FIGS. 2A-E illustrate further steps for processing the assembly 111 described above with reference to FIGS. 1A-G in accordance with an embodiment of the invention. For example, as shown in FIG. 2A, a third dielectric material 112 (such as a photoimagable, organic dielectric) can be disposed on the connection structure 140 to provide for electrical separation between the connection structure 140 and subsequent structures disposed on the assembly 111. The third dielectric material 112 can be disposed with any of the techniques described above with reference to the second dielectric material 135 and the first dielectric material 125 or, alternatively the third dielectric material 112 can be disposed with a print encapsulation process. Alternatively, any of the foregoing dielectric materials can be disposed with other techniques or processes. As shown in FIG. 2B, apertures 113 can be formed in the third dielectric material 112 to provide access to the connection structure 140. For example, the apertures 113 can be etched in the third dielectric material 112. Alternatively, the apertures 113 can be formed by other methods. In any of these embodiments, the apertures 113 can be filled with a conductive material in a manner generally similar to that described above with reference to FIG. 1G to form assembly connection sites 114, as shown in FIG. 2C. The assembly connection sites 114 can provide electrical communication to and from both the first microelectronic substrate 120 and the second microelectronic substrate 130 via the connection structure 140.

Figure 2D:
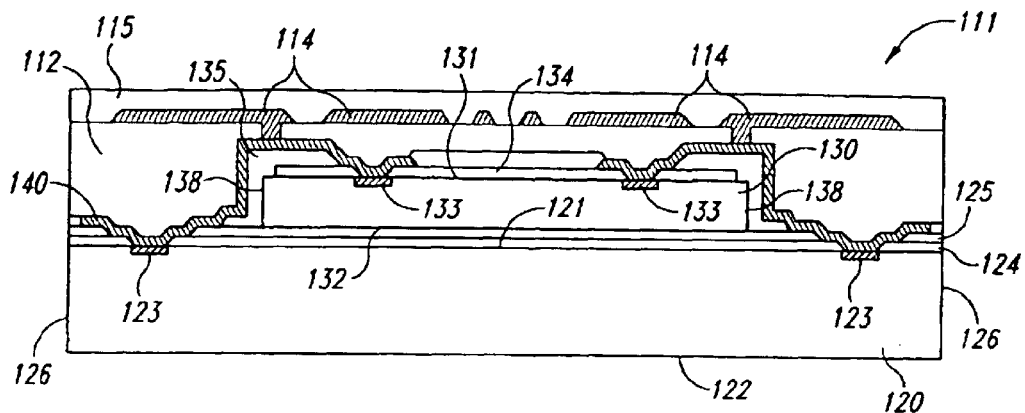
Figure 2E:
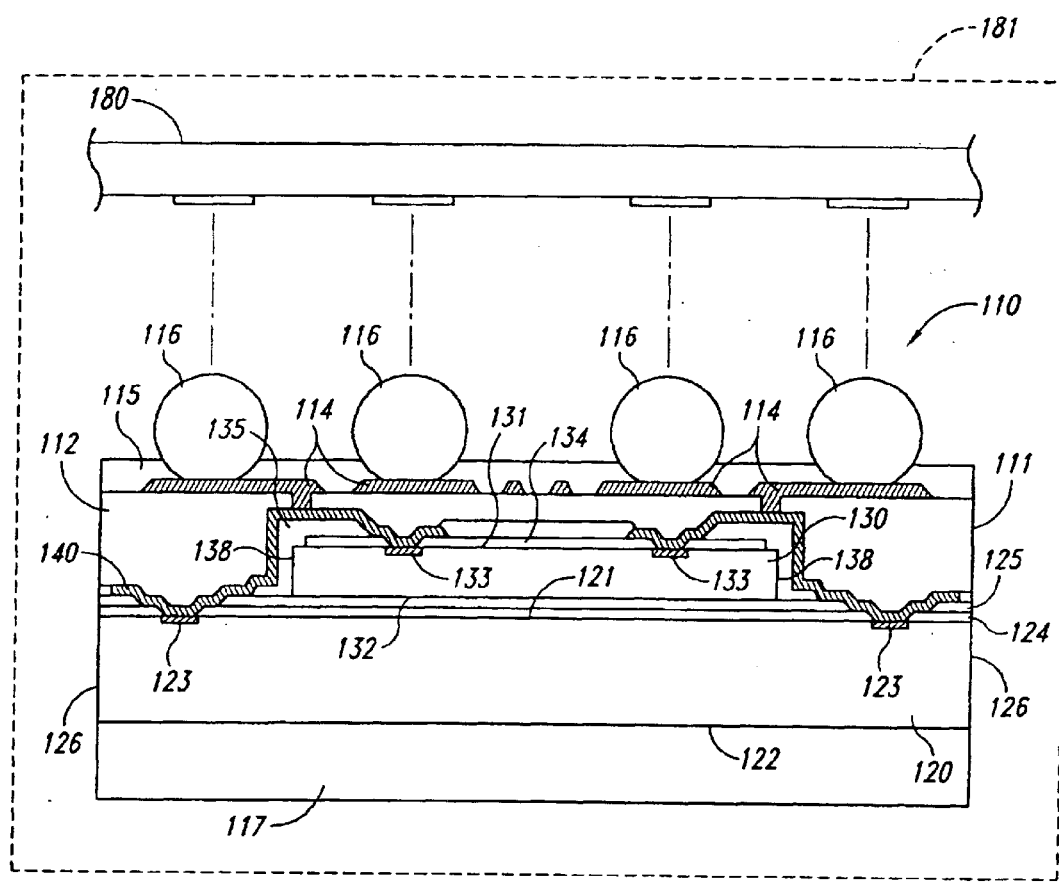

As shown in FIG. 2D, a fourth dielectric material 115 can be disposed on the assembly 111, including the connection sites 114, to protect the assembly 111. As shown in FIG. 2E, portions of the fourth dielectric material 115 aligned with the connection sites 114 can be removed, and a flowable conductive material 116, such as solder, can be disposed on the assembly connection sites 114 to form solder balls or other terminal structures. In one aspect of this embodiment, the connection sites can have a wetting layer formed from materials such as gold or a nickel-gold alloy to readily receive the flowable conductive material 116. Accordingly, the assembly 111 and the flowable conductive material 116 can define a package 110 that provides for electrical communication between the microelectronic substrates 120 and 130 and other microelectronic devices or circuit elements, such as a printed circuit board 180 or other device, shown schematically in FIG. 2E. The package 110 (along with other circuit devices) can be positioned in a housing 181 (also shown schematically in FIG. 2E) of an electronic product. When the first microelectronic substrate 120 is a biased device, the package 110 can further include a protective layer 117, such as a polymer film, to isolate the first microelectronic substrate 130 from the external environment. When the first microelectronic substrate 120 is unbiased, the protective film 117 can be eliminated.

One feature of an embodiment of the package 110 described above with reference to FIGS. 1A-2E is that the conductive structure 140 can include sequentially disposed portions of conductive material that form a conductive path between the first connection sites 123 and the second connection sites 133, and conform to the contour of the components that carry the connection structure 140. This feature can have several advantages. For example, the connection structure 140 can be shorter than a corresponding wire bond coupled between the first connection sites 123 and the second connection sites 133. Accordingly, the length of time required to transmit signals between the first and second connection sites 123 and 133 can be reduced compared with devices that include wire bonds.

Another advantage of an embodiment of the package 110 is that the connection structure 140 can extend in an orderly fashion in up to three orthogonal directions, in a manner generally similar to that employed for lines and vias within a semiconductor die. Accordingly, it can be easier to couple any of the first connection sites 123 to a corresponding second connection site 133 positioned at any arbitrary location on the second microelectronic substrate 130 without the risk of having wire bonds cross over and contact each other. Crossed wire bonds can cause a short circuit in the first microelectronic substrate 120 and/or the second microelectronic substrate 130.

Still a further advantage of an embodiment of the package 110 is that the connection structure 140 can form a reliable electrical bond with the first connection sites 123 and the second connection sites 133 in a process that does not exert a substantial physical pressure on either site. This is unlike conventional wire-bonding techniques in which a wire-bonding tool typically exerts a downward and/or lateral pressure on the connection sites, which can compromise the integrity of the connection sites and/or the microelectronic substrate.

Another feature of an embodiment of the package 110 described above is that the edges 126 of the first microelectronic substrate 120 can remain exposed after the package has been completed and at the time the package is connected to other devices or circuits because the package 110 (and in particular, the edges 126) need not be encapsulated. An advantage of this feature is that the overall planform area or footprint of the package 110 can be at least approximately identical to the planform area or footprint of the first microelectronic substrate 120. Accordingly, the footprint of the package 110 can be reduced compared to conventional packages which have an encapsulating material extending around the edges of the microelectronic substrate.

Figure 3:
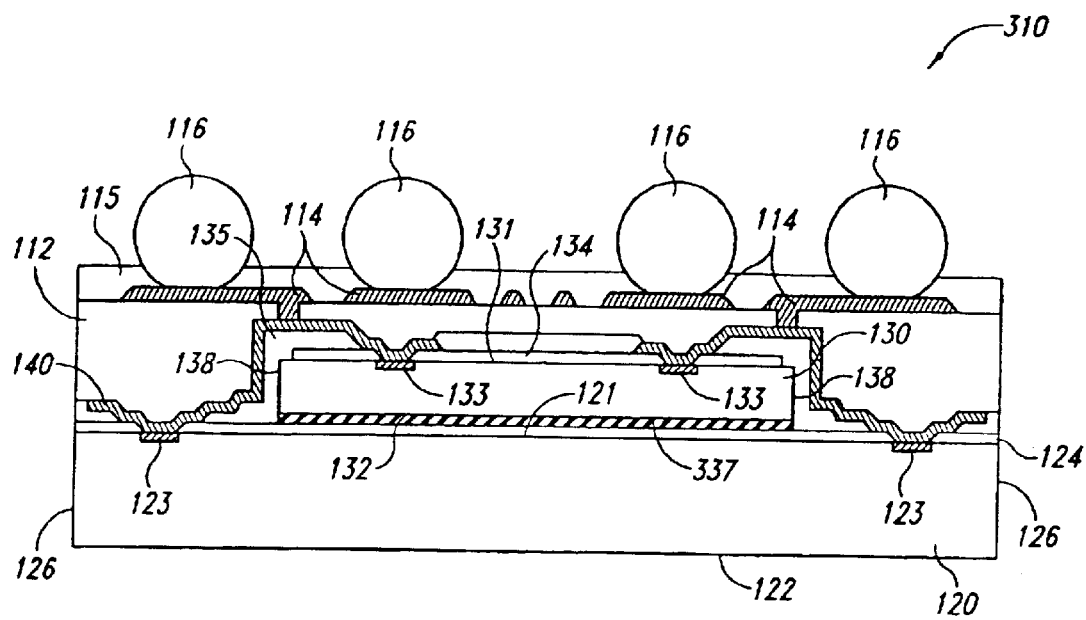
FIG. 3 is an illustration of an assembly having stacked microelectronic substrates adhesively attached to each other in accordance with an embodiment of the invention.

FIG. 3 is a partially schematic, cross-sectional, side view of a package 310 having a first microelectronic substrate 120 supporting a second microelectronic substrate 130 in accordance with another embodiment of the invention. In one aspect of this embodiment, the package 310 can include an adhesive film 337 positioned between the second surface 132 of the second microelectronic substrate 130 and the passivation layer 124 of the first microelectronic substrate 120. Accordingly, the first dielectric material 125 (FIGS. 1C-2E) can be eliminated. In one aspect of this embodiment, the adhesive film 337 can be attached first to the second microelectronic substrate 130 and then to the passivation layer 124 of the first microelectronic substrate 120 as the two microelectronic substrates are brought into contact with each other. The adhesive film 337 can include films such as Adwill LE tape, available from Lintec Corp. of Tokyo, Japan, modified (in accordance with methods known to those of ordinary skill in the art) to withstand the chemical and elevated temperature processes associated with embodiments of the present process. Alternatively, the adhesive film 337 can include another suitable material. For example, in one alternate embodiment, a polyimide or other high temperature, chemically stable material can be spin-coated or otherwise applied onto the second microelectronic substrate 130 at the wafer level, i.e., when the second microelectronic substrate 130 is still joined to other microelectronic substrates to form a wafer or a portion of a wafer. The applied material can then be soft-baked (generally similar to a partial cure) so that it retains its adhesive properties. A high temperature tape can then be laminated to the wafer and the wafer can be diced to form individual second microelectronic substrates 130, which are then attached to corresponding first microelectronic substrates 120 with the applied material.

Figure 4:
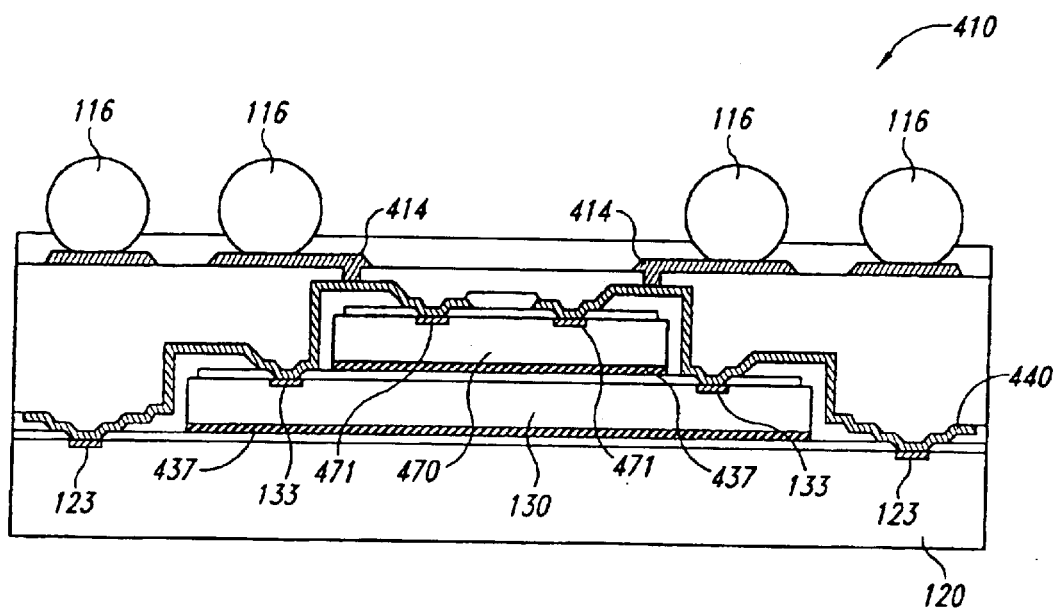
FIG. 4 is a partially schematic illustration of an assembly having three stacked microelectronic substrates in accordance with another embodiment of the invention.

FIG. 4 is a partially schematic, cross-sectional side view of a package 410 that includes a first microelectronic substrate 120, a second microelectronic substrate 130, and a third microelectronic substrate 470 stacked one upon the other in accordance with another embodiment of the invention. In one aspect of this embodiment, each of the microelectronic substrates can be connected to the microelectronic substrate below with an adhesive film 437, in a manner generally similar to that described above with reference to FIG. 3. Alternatively, the microelectronic substrates can be connected with a dielectric material, in a manner generally similar to that described above with reference to FIGS. 1C-D. In either embodiment, the package 410 can include a conductive structure 440 that links the first connection sites 123 of the first microelectronic substrate 120 with the second connection sites 133 of the second microelectronic substrate 130, and with third connection sites 471 of the third microelectronic substrate 470. The package 410 can further include assembly connection sites 414 and flowable conductive material elements 116 that provide communication to the microelectronic substrates in a manner generally similar to that described above. In still further embodiments, the package 410 can include more than three microelectronic substrates stacked upon each other.

Figure 5:
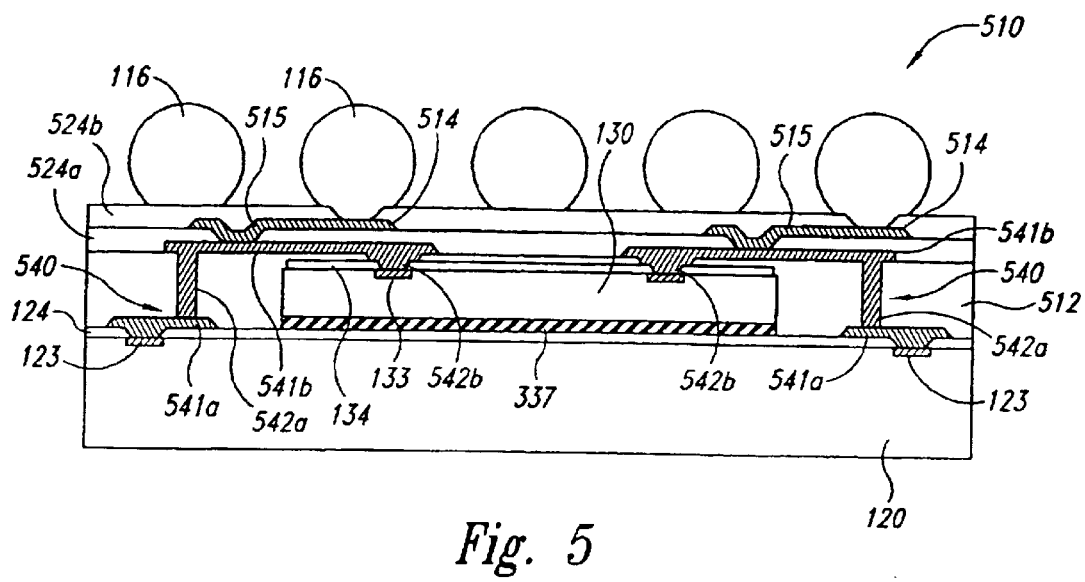
FIG. 5 is an illustration of an assembly having stacked microelectronic substrates in accordance with still another embodiment of the invention.

FIG. 5 is a partially schematic, cross-sectional side view of a package 510 having a first microelectronic substrate 120 supporting a second microelectronic substrate 130 with an adhesive film 337 in accordance with yet another embodiment of the invention. In one aspect of this embodiment, the package 510 can include a connection structure 540 electrically coupled between the first connection sites 123 of the first microelectronic substrate 120 and the second connection sites 133 of the second microelectronic substrate 130. In one aspect of this embodiment, the connection structure 540 can include a first transverse portion 541a connected to the first connection site 123. The connection structure 540 can further include a first upright portion 542a extending upwardly from the first transverse portion 541a, a second upright portion 542b extending upwardly from the second connection site 133, and a second transverse portion 541b extending transversely between the first and second upright portions 542a, 542b. In an alternate embodiment, the first transverse portion 541a can be eliminated, and the first upright portion 542a can be coupled directly to the first connection site 123. In either embodiment, the first upright portion 542a can extend through a high-aspect ratio etched hole or tunnel through a dielectric material 512. The dielectric material can include a deep etch photo-definable polymer, such as an SU-8 product, available from IBM of New York, N.Y. The connection structure 540 can accordingly be disposed on the package 510 by techniques such as sputtering, chemical vapor deposition, physical vapor deposition, or other techniques.

The connection structure 540 can further include links 515 to corresponding connection sites 514 that support flowable conductive material elements, 116, such as solder balls. The links 515 can be disposed in a single or dual damascene process on one or more passivation layers 524 (two are shown in FIG. 5 as passivation layers 524a, 524b). Accordingly, the flowable conductive material 116 can provide for electrical communication to the microelectronic substrates 120 and 130 within the package 510.

In one aspect of an embodiment of the package 510 described above with reference to FIG. 5, the connection structure 540 can include fewer discrete lateral and vertical segments, when compared to other embodiments described above with reference to FIGS. 1A-3. Accordingly, an advantage of an embodiment of the package 510 described above with reference to FIG. 5 is that it can be simpler and/or less expensive to manufacture. Conversely, an advantage of embodiments described above with reference to FIGS. 1A-3 is that the greater number of transverse and vertical segments can be used to route more complex paths between the first connection sites 123 and the second connection sites 133.

Figure 6:
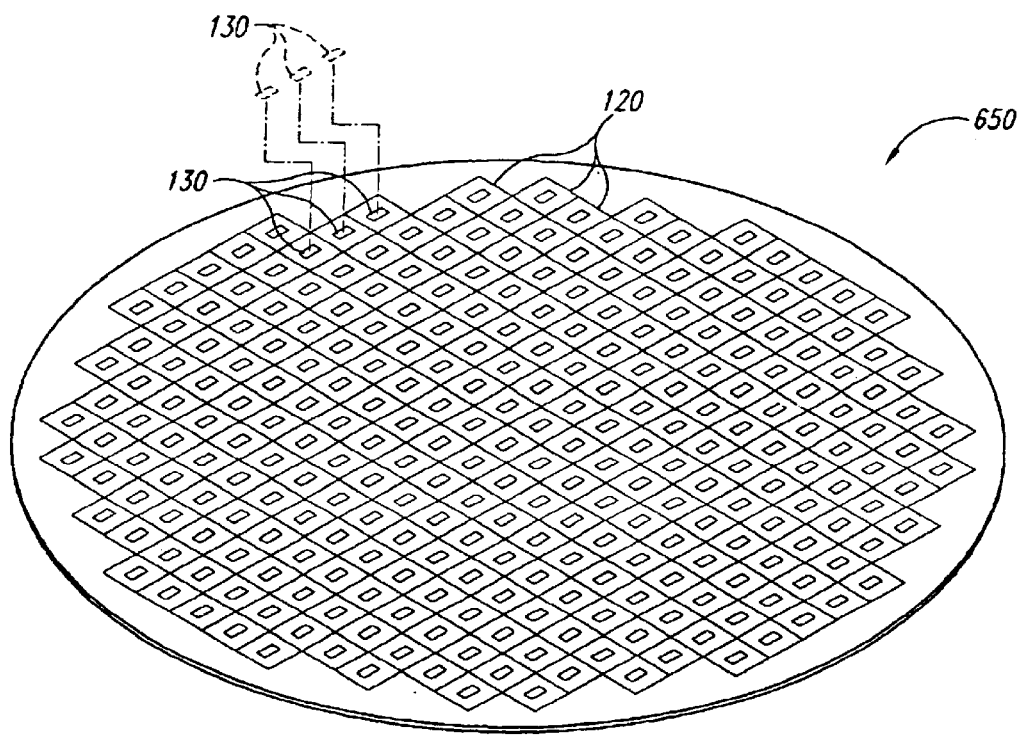
FIG. 6 is a partially schematic illustration of microelectronic substrates stacked upon each other and electrically connected at the wafer level prior to singulating the microelectronic substrates.

FIG. 6 is a partially schematic illustration of a process for stacking microelectronic substrates in accordance with another embodiment of the invention. In one aspect of this embodiment, a plurality of first microelectronic substrates 120 can be formed in a microelectronic wafer 650 and can remain attached to each other at the wafer level (i.e., "unsingulated") while a corresponding plurality of second microelectronic substrates 130 are attached and electrically coupled to each of the first microelectronic substrates 120. In one aspect of this embodiment, the second microelectronic substrates 130 can be attached to the first microelectronic substrates 120 by wet processing directly on the microelectronic wafer 650 in a manner generally similar to that described above with reference to FIGS. 1C-D.

In other embodiments, the second microelectronic substrates 130 can be attached to the first microelectronic substrates 120 with other techniques. For example, the second microelectronic substrates 130 can be attached to the first microelectronic substrates 120 with an adhesive film in a manner generally similar to that described above with reference to FIG. 3. One feature of the adhesive film is that it can be individually applied to each second microelectronic substrate 130 independently of the other second microelectronic substrates. Accordingly, each unit of the adhesive film will be smaller than an adhesive dielectric layer applied to the entire wafer 650. An advantage of this feature is that, to the extent the adhesive film shrinks at all during processing, each unit of adhesive film will shrink less than a dielectric layer covering the entire wafer 650. Another advantage is that if the adhesive film shrinks or otherwise changes characteristics, the change can have an effect that is limited to the interface between a single first microelectronic substrate 120 and a single second microelectronic substrate 130.

In any of the foregoing embodiments described above with reference to FIG. 6, each first microelectronic substrate 120 can be electrically coupled to the corresponding second microelectronic substrates 130 with conformal conductive structures generally similar to those described above with reference to FIGS. 1A-5. In an alternative embodiment, the first microelectronic substrates 120 can be electrically coupled to the second microelectronic substrates 130 with wire bonds. As described above, the conformal connection structure can have several advantages over wire bonds and can accordingly be used for packages that benefit from those advantages. Conversely, wire bonding can have advantages over the conformal connection structure in certain cases. For example, wire bonding can be less expensive to apply when the connections between the first and second microelectronic substrates 120, 130 are relatively few and/or relatively simple.

In any of the foregoing embodiments described with reference to FIG. 6, the first microelectronic substrates 120 can be separated or "singulated" from each other and from the microelectronic wafer 650 after the second microelectronic substrates 130 have been attached and electrically connected to the corresponding first microelectronic substrates 120. Accordingly, the singulated packages produced by this process can appear generally similar to any of those described above with reference to FIGS. 2E and 3-5. Alternatively, the singulated packages can have other arrangements with at least one microelectronic substrate stacked on another.

One advantage of connecting the second microelectronic substrates 130 to the first microelectronic substrates 120 at the wafer level is that the process can be completed more quickly and more efficiently than connecting the microelectronic substrates after they have been singulated. Another advantage is that the microelectronic wafer 650 can stabilize the first microelectronic substrates 120 so that the connections made to the first microelectronic substrates 120 can be more precise, robust, and/or reliable than if the second microelectronic substrates 130 were attached after the first microelectronic substrates 120 had been singulated.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method for packaging microelectronic substrates, comprising:
positioning a first microelectronic substrate proximate to a second microelectronic substrate, the first microelectronic substrate having a first surface with a first connection site and further having a second surface facing opposite the first surface, the second microelectronic substrate having a first surface with a second connection site and further having a second surface facing opposite the first surface;
coupling the first microelectronic substrate to the second microelectronic substrate to form a substrate assembly with the first surface of the first microelectronic substrate facing toward the second surface of the second microelectronic substrate; and
sequentially disposing at least first and second portions of a conductive material on the substrate assembly to build up a conductive structure connected between the first connection site of the first microelectronic substrate and the second connection site of the second microelectronic substrate.

2. The method of claim 1, further comprising:
disposing a first portion of dielectric material on the first microelectronic substrate;
disposing a second portion of dielectric material on the second microelectronic substrate; and
conforming the conductive material to the first and second portions of dielectric material.

3. The method of claim 1, further comprising:
disposing a first portion of dielectric material on the first microelectronic substrate;
stacking the second microelectronic substrate on the first microelectronic substrate;
disposing a second portion of dielectric material on the second microelectronic substrate;
conforming the conductive material to the first and second portions of dielectric material;
disposing a third portion of dielectric material on the conductive material;
coupling a third connection site to the conductive material with the third connection site electrically coupled to the first and second connection sites; and
disposing a volume of flowable conductive material on the third connection site to provide electrical communication with the first and second microelectronic substrates.

4. The method of claim 1, further comprising positioning the first and second microelectronic substrates with the first and second connection sites facing in at least approximately the same direction.

5. The method of claim 1 wherein the first microelectronic substrate is one of a plurality of first microelectronic substrates, the second microelectronic substrate is one a plurality of second microelectronic substrates, and the connection structure is one of a plurality of connection structures, and wherein the method further comprises:
while the first microelectronic substrates are attached to each other to define at least a portion of a microelectronic wafer, coupling each of the plurality of second microelectronic substrates to a corresponding one of the plurality of first microelectronic substrates to form a plurality of substrate assemblies;
for each substrate assembly, sequentially disposing portions of the conductive material to build up one of the conductive structures connected between the first and second connection sites of each substrate assembly; and
separating the substrate assemblies from each other.

6. The method of claim 1, further comprising electrically coupling the substrate assembly to a microelectronic device external to the assembly while at least one edge of the first microelectronic substrate is exposed.

7. The method of claim 1, further comprising disposing a dielectric material on the first microelectronic substrate and conforming the conductive structure to a contour of the dielectric material.

8. The method of claim 1, further comprising:
selecting the first microelectronic substrate to have a first planform area in the plane of the second surface of the first microelectronic substrate; and
selecting the second microelectronic substrate to have a second planform area in the plane of the second surface of the second microelectronic substrate, with the second planform area less than the first planform area.

9. The method of claim 1, further comprising disposing a dielectric material between the first surface of the first microelectronic substrate and the second surface of the second microelectronic substrate and coupling the first and second microelectronic substrates to each other by adhering the first and second microelectronic substrates to the dielectric material.

10. The method of claim 1 wherein coupling the first and second microelectronic substrates includes connecting the first and second microelectronic substrates to an intermediate structure.

11. The method of claim 1, further comprising disposing an adhesive film on the second microelectronic substrate and contacting the adhesive film with the first microelectronic substrate to adhere the second microelectronic substrate to the first microelectronic substrate.

12. The method of claim 1 wherein disposing the conductive material includes disposing the conductive material to form an elongated conductive structure that extends in three orthogonal directions between the first and second connection sites.

13. The method of claim 1 wherein disposing the conductive material includes disposing a non-self-supporting conductive material between the first and second connection sites.

14. The method of claim 1 wherein disposing the conductive material includes depositing the conductive material by sputtering, chemical vapor deposition or physical vapor deposition.

15. The method of claim 1, further comprising selecting the first microelectronic substrate to include an SRAM device and selecting the second microelectronic substrate to include a flash memory device.

16. The method of claim 1 wherein the conductive material is a first conductive material, and wherein the method further comprises:
coupling a third microelectronic substrate to the second microelectronic substrate, the third microelectronic substrate having a first surface with a third connection site, the third microelectronic substrate further having a second surface facing opposite the first surface, the second surface of the third microelectronic substrate facing toward the first surface of second microelectronic substrate; and
sequentially disposing first and second portions of a second conductive material on the substrate assembly to extend the conductive structure connected between the third connection site of the third microelectronic substrate and the second connection site of the second microelectronic substrate.

17. A method for packaging microelectronic substrates, comprising:
positioning a first microelectronic substrate proximate to a second microelectronic substrate, the first microelectronic substrate having a first surface with a first connection site and further having a second surface facing opposite the first surface, the second microelectronic substrate having a first surface with a second connection site and further having a second surface facing opposite the first surface;
coupling the first microelectronic substrate to the second microelectronic substrate to form a substrate assembly with the first surface of the first microelectronic substrate facing toward the second surface of the second microelectronic substrate; and
electrically connecting the first and second connection sites by disposing a conductive material on the substrate assembly between the first and second connection sites and conforming the conductive material at least generally to a contour of the substrate assembly immediately adjacent to the conductive material.

18. The method of claim 17 wherein coupling the first and second microelectronic substrates includes coupling the first and second microelectronic substrates with the first and second connection sites facing in at least approximately the same direction.

19. The method of claim 17 wherein electrically connecting the first and second connection sites includes conforming the conductive material to a contour defined by a dielectric material on the first surface of at least one of the first and second microelectronic substrates.

20. The method of claim 17, further comprising disposing at least one dielectric material on the first and second microelectronic substrates to form a first layer portion adjacent to the first microelectronic substrate and a second layer portion adjacent to the second microelectronic substrate, and conforming the conductive material to the first and second layer portions.

21. The method of claim 17, further comprising disposing a generally non-conductive material on the second surface of the first microelectronic substrate.

22. The method of claim 17 wherein disposing the conductive material includes sequentially disposing at least first and second portions of the conductive material on the substrate assembly to build up a conductive structure connected between the first connection site of the first microelectronic substrate and the second connection site of the second microelectronic substrate.

23. The method of claim 17, further comprising:
disposing a first portion of dielectric material on the first microelectronic substrate;
stacking the second microelectronic substrate on the first microelectronic substrate;
disposing a second portion of dielectric material on the second microelectronic substrate;
conforming the conductive material to the first and second portions of dielectric material;
disposing a third portion of dielectric material on the conductive material;
coupling a third connection site to the conductive material with the third connection site electrically coupled to the first and second connection sites; and
disposing a volume of flowable conductive material on the third connection site to provide electrical communication with the first and second microelectronic substrates.

24. The method of claim 17 wherein the first microelectronic substrate includes one of a plurality of first microelectronic substrates, the second microelectronic substrate includes one a plurality of second microelectronic substrates, and the connection structure is one of a plurality of connection structures, and wherein the method further comprises:
while the first microelectronic substrates are attached to each other to define at least a portion of a microelectronic wafer, coupling each of the plurality of second microelectronic substrates to a corresponding one of the plurality of first microelectronic substrates to form a plurality of substrate assemblies;
for each substrate assembly, sequentially disposing portions of the conductive material to build up one of the conductive structures connected between the first and second connection sites of each substrate assembly; and
separating the substrate assemblies from each other.

25. The method of claim 17 wherein coupling the first and second microelectronic substrates includes connecting the first and second microelectronic substrates to an intermediate structure.

26. The method of claim 17 wherein disposing the conductive material includes disposing the conductive material to form an elongated conductive structure that extends in three orthogonal directions between the first and second connection sites.

27. The method of claim 17 wherein disposing the conductive material includes disposing a non-self-supporting conductive material between the first and second connection sites.

28. A method for packaging microelectronic substrates, comprising:

positioning a plurality of unsingulated first microelectronic substrates proximate to a corresponding plurality of singulated second microelectronic substrates while the first microelectronic substrates are connected to each other to form at least a portion of a microelectronic wafer, wherein each first microelectronic substrate has a first surface with a first connection site and further has a second surface facing opposite the first surface, and each second microelectronic substrate has a first surface with a second connection site and further has a second surface facing opposite the first surface;

attaching each second microelectronic substrate to a corresponding one of the plurality of first microelectronic substrates to form a plurality of substrate assemblies with the first surface of each first microelectronic substrate facing in at least approximately the same direction as the first surface of the corresponding second microelectronic substrate, and with the second surface of each second microelectronic substrate facing toward the first surface of the corresponding first microelectronic substrate; and for each substrate assembly, electrically connecting the first connection site of the first microelectronic substrate to the second connection site of the corresponding second microelectronic substrate with a conductive structure.

29. The method of claim 28 wherein electrically connecting the first and second connection sites of each substrate assembly includes sequentially disposing at least first and second portions of a conductive material on the substrate assembly to build up the conductive structure.

30. The method of claim 28 wherein electrically connecting the first and second connection sites of each substrate assembly includes conforming the conductive structure at least generally to a contour of the substrate assembly.

31. The method of claim 28, further comprising for each substrate assembly:

disposing a first portion of dielectric material on the first microelectronic substrate;

disposing a second portion of dielectric material on the second microelectronic substrate; and conforming the conductive material to the first and second portions of dielectric material.

32. The method of claim 28, further comprising:

disposing a first portion of dielectric material on the first microelectronic substrate;

stacking the second microelectronic substrate on the first microelectronic substrate;

disposing a second portion of dielectric material on the second microelectronic substrate;

conforming a conductive material of the conductive structure to the first and second portions of dielectric material;

disposing a third portion of dielectric material on the conductive material;

coupling a third connection site to the conductive material with the third connection site electrically coupled to the first and second connection sites; and disposing a volume of flowable conductive material on the third connection site to provide electrical communication with the first and second microelectronic substrates.

33. The method of claim 28, further comprising positioning the first and second microelectronic substrates with the first and second connection sites facing in at least approximately the same direction.

34. The method of claim 28, further comprising disposing a dielectric material on the first microelectronic substrate and conforming the conductive structure to a contour of the dielectric material.

35. The method of claim 28 wherein disposing the conductive structure includes disposing the conductive structure to form an elongated conductive structure that extends in three orthogonal directions between the first and second connection sites.

36. The method of claim 28 wherein disposing the conductive structure includes disposing a non-self-supporting conductive material between the first and second connection sites.

37. A method for packaging microelectronic substrates, comprising:

positioning a plurality of unsingulated first microelectronic substrates proximate to a corresponding plurality of singulated second microelectronic substrates while the first microelectronic substrates are connected to each other to form at least a portion of a microelectronic wafer, wherein each first microelectronic substrate has a first surface with a first connection site and further has a second surface facing opposite the first surface, and each second microelectronic substrate has a first surface with a second connection site and further has a second surface facing opposite the first surface;

attaching each second microelectronic substrate to a corresponding one of the plurality of first microelectronic substrates to form a plurality of substrate assemblies with the first surface of each first microelectronic substrate facing in at least approximately the same direction as the first surface of the corresponding second microelectronic substrate, and with the second surface of each second microelectronic substrate facing toward the first surface of the corresponding first microelectronic substrate, and with the first and second connection sites facing in at least approximately the same direction; and for each substrate assembly, electrically connecting the first connection site of the first microelectronic substrate to the second connection site of the corresponding second microelectronic substrate by sequentially disposing at least first and second portions of a conductive material on the substrate assembly to build up a conforming elongated conductive structure connected between the first and second connection sites, at least a portion of the conductive structure conforming at least generally to a contour of the substrate assembly.

38. The method of claim 37, further comprising:

disposing a first portion of dielectric material on the first microelectronic substrate;

disposing a second portion of dielectric material on the second microelectronic substrate; and conforming the conductive material to the first and second portions of dielectric material.

39. The method of claim 37, further comprising:

disposing a first portion of dielectric material on the first microelectronic substrate;

stacking the second microelectronic substrate on the first microelectronic substrate;

disposing a second portion of dielectric material on the second microelectronic substrate;

conforming the conductive material to the first and second portions of dielectric material;

disposing a third portion of dielectric material on the conductive material;

coupling a third connection site to the conductive material with the third connection site electrically coupled to the first and second connection sites; and disposing a volume of flowable conductive material on the third connection site to provide electrical communication with the first and second microelectronic substrates.

40. The method of claim 37, further comprising disposing a dielectric material between the first surface of the first microelectronic substrate and the second surface of the second microelectronic substrate and coupling the first and second microelectronic substrates to each other by adhering the first and second microelectronic substrates to the dielectric material.

41. A method for packaging microelectronic substrates, comprising:

positioning a first microelectronic substrate proximate to a second microelectronic substrate, the first microelectronic substrate having a first surface with a first connection site and further having a second surface facing opposite the first surface, the second microelectronic substrate having a first surface with a second connection site and further having a second surface facing opposite the first surface;

coupling the first and second microelectronic substrates to form a stacked substrate assembly with the first surface of the first microelectronic substrate facing toward the second surface of the second microelectronic substrate;

connecting the first connection site to the second connection site with a conductive connector; and providing the assembly for connecting to other microelectronic devices while a planform area of the assembly in a plane generally parallel to the second surface of the first microelectronic substrate has a size and shape at least approximately identical to that of the second surface of the first microelectronic substrate.

42. The method of claim 41 wherein coupling the first and second microelectronic substrates includes coupling the first and second microelectronic substrates with the first and second connection sites facing in generally the same direction.

43. The method of claim 41 wherein the first microelectronic substrate has a planform area larger than a planform area of the second microelectronic substrate, and wherein providing the assembly for connecting to other microelectronic devices includes providing the assembly without disposing an encapsulating material around an edge of the first microelectronic substrate between the first and second surfaces of the first microelectronic substrate.

44. The method of claim 41, further comprising electrically coupling the substrate assembly to an external electronic device while an edge of the first microelectronic substrate between the first and second surfaces of the first microelectronic substrate is exposed.

45. The method of claim 41 wherein connecting the first and second connection sites includes sequentially disposing at least first and second portions of a conductive material on the substrate assembly to build up a conforming elongated conductive structure connected between the first and second connection sites.

46. A method for packaging microelectronic substrates, comprising:

positioning a first microelectronic substrate proximate to a second microelectronic substrate while the first microelectronic substrate forms at least a portion of a microelectronic wafer, the first microelectronic substrate having a first surface with a first connection site and further having a second surface facing opposite the first surface, the second microelectronic substrate having a first surface with a second connection site and further having a second surface facing opposite the first surface;

coupling the first and second microelectronic substrates to form a stacked substrate assembly with the first surface of the first microelectronic substrate facing toward the second surface of the second microelectronic substrate;

connecting the first connection site to the second connection site with a conductive connector;

singulating the first microelectronic substrate from other first microelectronic substrates of the microelectronic wafer after connecting the first connection site to the second connection site; and electrically connecting the substrate assembly to other microelectronic devices while edges of the first microelectronic substrate between the first and second surfaces of the first microelectronic substrate remain exposed.

47. The method of claim 46 wherein coupling the first and second microelectronic substrates includes coupling the first and second microelectronic substrates with the first and second connection sites facing in generally the same direction.

48. The method of claim 46, further comprising electrically coupling the substrate assembly to an external electronic device while edge of the first microelectronic substrate between the first and second surfaces of the first, microelectronic substrate is exposed.

49. The method of claim 46 wherein connecting the first and second connection sites includes sequentially disposing at least first and second portions of a conductive material on the substrate assembly to build up a conforming elongated conductive structure connected between the first and second connection sites.

* * * * *

UNITED STATES PATENT AND TRADEMARK OFFICE
CERTIFICATE OF CORRECTION

PATENT NO. : 6,841,418 B2
DATED : January 11, 2005
INVENTOR(S) : Mai-Huong Tran

It is certified that error appears in the above-identified patent and that said Letters Patent is hereby corrected as shown below:

<u>Column 2,</u>
Line 63, "through" should be -- thorough --.

Signed and Sealed this

Twenty-third Day of August, 2005

JON W. DUDAS
*Director of the United States Patent and Trademark Office*